United States Patent [19]
Slocum

[11] Patent Number: 5,924,003
[45] Date of Patent: Jul. 13, 1999

[54] METHOD OF MANUFACTURING BALL GRID ARRAYS FOR IMPROVED TESTABILITY

[75] Inventor: Alexander H. Slocum, Bow, N.H.

[73] Assignee: Kinetrix, Inc., Bedford, N.H.

[21] Appl. No.: 08/970,184

[22] Filed: Nov. 14, 1997

[51] Int. Cl.[6] .................................................. H01L 21/44
[52] U.S. Cl. .......................................... 438/612; 438/613
[58] Field of Search ................................. 438/14, 15, 16, 438/17, 18, 106–129, 612, 613, 614

[56] References Cited

U.S. PATENT DOCUMENTS

| | | | |
|---|---|---|---|
| 5,066,614 | 11/1991 | Dunaway et al. | 438/123 |
| 5,289,631 | 3/1994 | Koopman | 438/15 |
| 5,483,741 | 1/1996 | Akram et al. | 438/614 |
| 5,547,530 | 8/1996 | Nakamura et al. | 438/613 |
| 5,548,884 | 8/1996 | Kim | 438/15 |
| 5,559,054 | 9/1996 | Adamjee | 438/617 |
| 5,585,282 | 12/1996 | Wood et al. | 438/613 |
| 5,633,204 | 5/1997 | Tago et al. | 438/614 |
| 5,668,058 | 9/1997 | Tanioka et al. | 438/108 |
| 5,739,053 | 4/1998 | Kawakita et al. | 438/108 |

*Primary Examiner*—Kevin M. Picardat
*Attorney, Agent, or Firm*—Edmund J. Walsh

[57] ABSTRACT

A ball grid array package for integrated circuit chips that is designed to facilitate testing. The balls are planarized with high precision to make electrical contact more accurate for testing. Contact, even on fine pitched arrays, can be readily made. A machine for planarizing the solder balls is disclosed. Also, a contact array, as well as a method of making the contact array are disclosed.

20 Claims, 3 Drawing Sheets

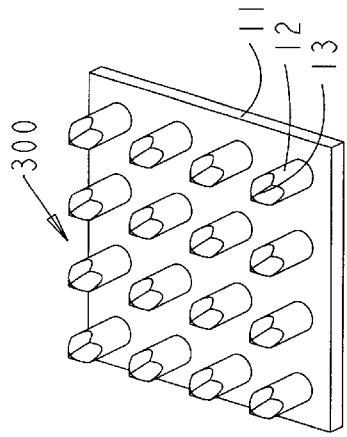
FIG. 3a
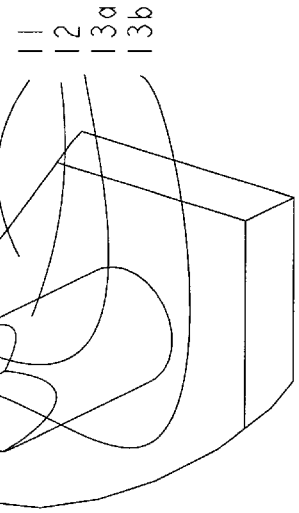
FIG. 3b
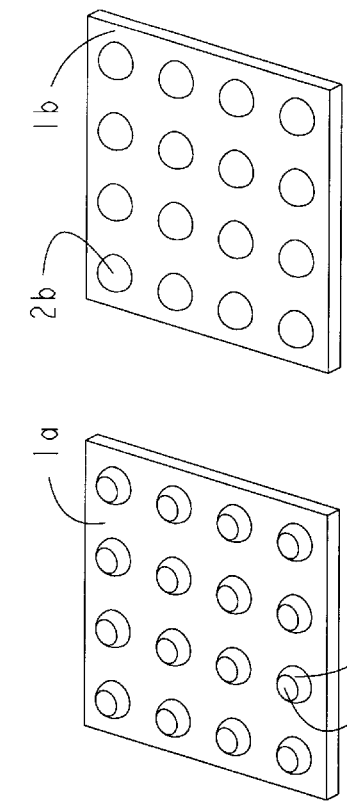
FIG. 1A (PRIOR ART)
FIG. 1B
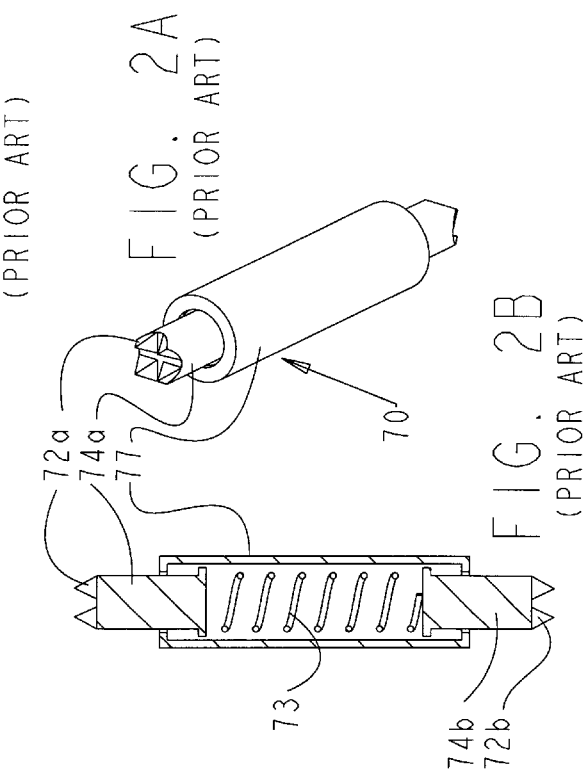
FIG. 2A (PRIOR ART)
FIG. 2B (PRIOR ART)

METHOD OF MANUFACTURING BALL GRID ARRAYS FOR IMPROVED TESTABILITY

This invention relates generally to the manufacture of ball grid array integrated circuit chips and more specifically to a method for manufacturing ball grid arrays to improve testability.

Some integrated circuit chips are packaged in what are termed ball grid arrays. In a ball grid array, the integrated circuit is encapsulated in an insulating material. Electrical contact is made to the integrated circuit through a series of pads on the underside of the package. When the ball grid array is manufactured, a ball of solder is placed on each of the pads. FIG. 1A illustrates the underside of a circuit package 1b with balls of solder 2b. The solder balls 2b are made by placing a small amount of solder paste on each pad. The package is then heated in an oven, which melts the solder paste. The solder past bonds to the pad, but, because of surface tension, stays generally spherical.

To attach the ball grid array to a printed circuit board, the balls of solder are aligned with conductive pads on the printed circuit board. The solder is then heated to the melting point, soldering the ball grid array to the printed circuit board. Again, surface tension maintains the general shape and location of the solder on the pads.

One advantage of ball grid arrays is that they allow many more contacts to the integrated circuit than can be provided with conventional wire leads. The solder balls are also more robust than conventional wire leads and therefore less likely to be damaged.

One problem with having so many leads so close together is that it then becomes difficult to make reliable electrical contact to the leads of the integrated circuit chips for testing. Manufacturers of semiconductor chips generally test every function of every chip to ensure high standards of reliability and quality are met. In addition, testing allows devices to be sorted into performance categories. Thus, it is important for there to be a reliable way to make electrical contact to all of the solder balls on a ball grid array.

Traditionally, electrical contact for testing has been made with flexible mechanical contacts. Spring loaded pins are often used to make contact to the solder balls. FIGS. 2A and 2B show a typical spring type contact pin. FIG. 2A is an isometric view and FIG. 2B is a cross section. Shafts 74a and 74b have sharp edged tips 72a and 72b. The shafts 74a and 74b are retained within barrel 77. Shafts 74a and 74b are biased outwards by a spring 73. One of the shafts 74a or 74b is pressed against a circuit board that makes contact to a test system. The other of the shafts 74a or 74b presses against the solder ball. The sharp edge tips 72a or 72b break through oxide layers that form on the solder balls, thereby providing good electrical contact. Sharp edge tips 72a or 72b are disposed to make a concave surface on the ends of shafts 74a and 74b. This shape ensures that shaft 74a or 74b does not slip off the rounded surface of the ball.

However, there are certain drawbacks to using spring loaded pins for making contact during testing. One problem is that the spring 73, though conducting, provides poor electrical characteristics for transmitting signals. Spring 73 can cause undesirable distortion of test signals, particularly at high frequencies. A second problem is that the concave shape of sharp edged probe tips 72a and 72b leads to crevices between the sharp edges. Each time the probe tip is inserted into a solder ball, some of the oxide or solder from the ball will stick to the probe tip within the crevices. After a few tens of thousand uses, the amount of material within the crevice can build up to the point of making the spring loaded pin unusable.

Another type of contact that has been used is called a bending beam type contact. The contact includes a long thin conducting beam. As the contact is pressed against a solder ball, the beam deflects. Deflection of the beams adjusts for differences in the heights of the solder balls as well as provides a force the makes an electrical contact between the beam and the solder ball.

We have discovered a source of difficulty in making contact to fine pitch ball grid arrays, particularly with beam type contacts. Our experiments have shown that the solder balls in a ball grid array vary in height by as much as ±0.025 mm, for a total deviation of 0.05 mm. To make reliable electrical contact, to the solder balls, the beam should travel a distance equal to nearly 10 times the deviation, or 0.5 mm. Though many designs for flexible contact elements exist that can accommodate a total deviation of 0.05 mm, these designs require that the contact elements have a length-to-deflection ration of about 20:1. Thus, in order to achieve the flexibility required to make reliable contact to the solder balls of a ball grid array, the beam must have a length of about 1 mm.

However, it is exceedingly difficult to make a mechanical contact which can provide the required deflection if the bending portion of the contact element has a length of less than 1 mm. If the length-to-deflection ratio gets too small, the contact elements will be permanently deformed and thereafter cease to function reliably. If the spacing between the solder balls on the ball grid array is made smaller than 1 mm, there will be insufficient room to make contact elements with the required length. Many manufacturers have expressed a desire to make ball grid arrays with spacing between solder balls of 0.5 mm within the next few years.

Thus, we have recognized that, in order to accurately test ball grid arrays of very fine pitch, below 1 mm, it will be highly desirable to reduce the deviation in the heights of the solder balls. As described herein, we have developed a manufacturing technique that leads to ball grid arrays with very little deviation in the height of the solder balls that is far more testable.

SUMMARY OF THE INVENTION

With the foregoing background in mind, it is an object of the invention to provide an improved method of manufacturing ball grid arrays.

It is also an object to provide an improved method of testing ball grid arrays.

The foregoing and other objects are achieved by manufacturing a ball grid array with a method that includes a step of planarizing the balls of the ball grid array. In a preferred embodiment, planarization is achieved in a machine that holds the ball grid array packages at a precise distance relative to a cutting blade, which then cuts off the upper surface of the solder balls, thereby providing solder balls of uniform height and also with flat surfaces to which contact can be made for testing.

BRIEF DESCRIPTION OF THE DRAWINGS

The invention will be better understood by reference to the following more detailed description and accompanying drawings in which FIG. 1A shows a ball grid array according to the prior art;

FIG. 1B shows a ball grid array according to a preferred embodiment of the invention;

FIG. 2A is an isometric view of a prior art spring pin contact;

FIG. 2B is a cross sectional view of the spring pin of FIG. 2A;

FIG. 3A is an isometric view of a probe according to one embodiment of the invention;

FIG. 3B is an enlarged view of one of the probe tips of FIG. 3A;

DESCRIPTION OF THE PREFERRED EMBODIMENT

Figure 4:
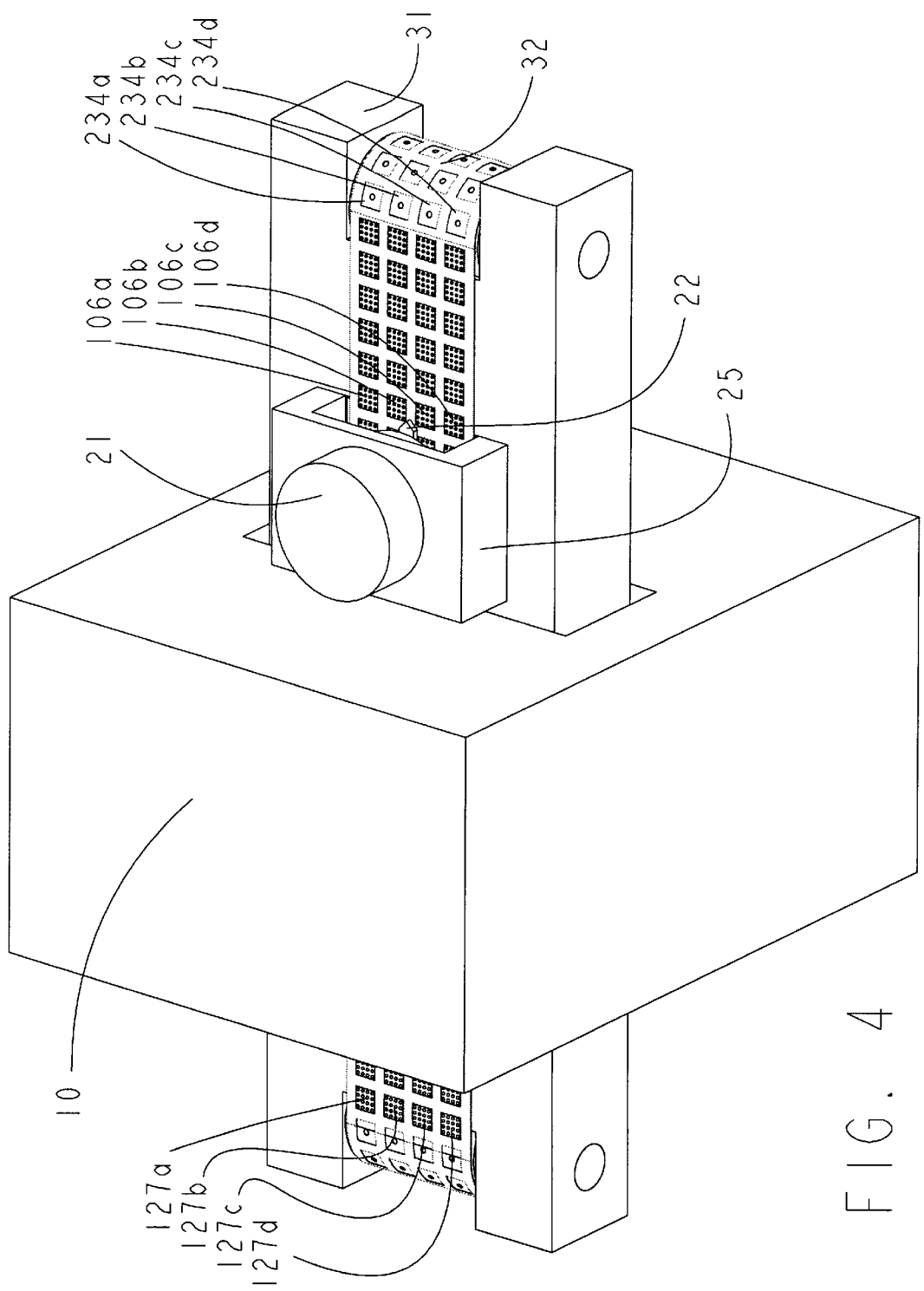
FIG. 4 is an isometric view of a machine useful for planarizing ball grid arrays according to one embodiment of the invention.

FIG. 1B shows a ball grid array 1a where the solder balls 2a have been shaped to facilitate testing. In particular, each of the solder balls 2a has been made with a flat region 3 on top. The flat regions 3 provide an area where a test pin can contact the solder balls without the tendency to slip off. Thus, a concave shape to sharp edged probes, such as shown in FIGS. 2A and 2B is not required. Without the concave shape, the crevices that lead to a build up of solder or oxide on the probe tips is thereby eliminated and the useful life of the probe tip is extended.

Additionally, as will be described in greater detail below, the process for forming the flat regions 3 on the solder balls can also be used to "planarize" the solder balls, which means to make all of the solder balls the same height to within a very tight tolerance. Preferably, the height of the solder balls will vary by less than 10 microns. With the device described below, the deviation in the height of the solder balls should be less than 5 microns, with a target value of about 1 micron.

One important advantage of planarizing the ball grid array is that the amount of travel of the contact elements is greatly reduced. The need for flex of the contact elements might be eliminated, and substantially rigid probes might even be used. FIG. 3A shows an isometric view of a rigid contactor array 300 that could be used to contact the planarized ball grid array 1a.

Contactor array 300 has a base 11 in which many conductive traces (not shown) are routed. Base 11 could be made using technology similar to that used for making printed circuit boards. Other known techniques, such as depositing metal traces in ceramic substrates could also be used to make base 11.

A plurality of posts 12 are formed on base 11. Posts 12 might, for example be soldered or brazed to the conductive traces. Each post 12 is in electrical contact with one of the conductive traces in base 11 and forms one contact. The ends of posts 12 are given a concave shape. In a preferred embodiment, the ends of posts 12 have tips 13 that are sufficiently pointed to pierce an oxide layer on a solder ball 2a (FIG. 1B).

Tips 13 may be formed by grinding posts 12 with a profiled grinding wheel. In the illustrated embodiment, the grinding wheel is shaped to grind a shape of a half ellipse on two sides of post 12. To form points, the array of contacts is placed on a profile grinding wheel grinds the tips in one direction. The wheel is positioned to grind the posts in one row at a time. The array is rotated 90° and the posts are ground in an orthogonal direction to form the tips as illustrated.

The grinding operation on posts 12 is preferably performed with a precision machine, such as a profile grinder with a CNC dresser to dress the wheel. Grinding with a precision machine also has the desirable effect of planarizing the contact array. Commercially available precision grinding allow the heights of tips 13 to be planarized to within 1 micron. However, lower tolerances, such as to within 10 microns, might also be used.

With the solder balls 2a and the probe tips 13 planarized, when the array of solder balls 2a and the array of probe tips 12 are brought together, only a short amount of travel of the probe tips 13 will be required to ensure that every probe tip 13 pierces the oxide layer of its corresponding solder ball and makes good electrical contact with the corresponding solder ball 2a. Sufficient electrical contact can be achieved with a force on contactor array 300 on the order of tens of grams per post.

Contactor array 300, when used in conjunction with a ball grid array that has been planarized, has several advantages over the prior art. One advantage is that it does not require highly flexible beams. Thus, the system can be used on ball grid arrays with very small pitch. Because the solder balls have flat upper surfaces, the probe tips do not need to have concave surfaces which can become clogged with solder after repeated use.

Turning to FIG. 4, a machine to rapidly planarize balls 2a is shown. In a preferred embodiment, the tools for planarizing are incorporated into an oven 10 that is used to melt the solder paste to form solder balls. Devices, such as 127a . . . 127d, are loaded onto a special conveyor belt 32 held by a frame 31. Belt 32 passes into oven 10 where the temperature is raised sufficiently to melt the solder paste on the devices 127a . . . 127d and turn them into balls.

As devices 127a . . . 127d exit oven 10, conveyor belt 32 brings them under precision motorized spindle 21 on frame 25, which straddles conveyor belt 32. Diamond tipped flycutting tool 22 is mounted to spindle 21. Diamond tipped flycutting tool 22 is positioned to have a height above the devices carried on conveyor 32 that is close enough to cut the tops off solder balls on the devices as the flycutting tool 22 rotates on spindle 21. The devices, such as 106a . . . 106d, carried on conveyor 32 past flycutting tool 22 have solder balls as shown in FIG. 1B.

Figure 5:
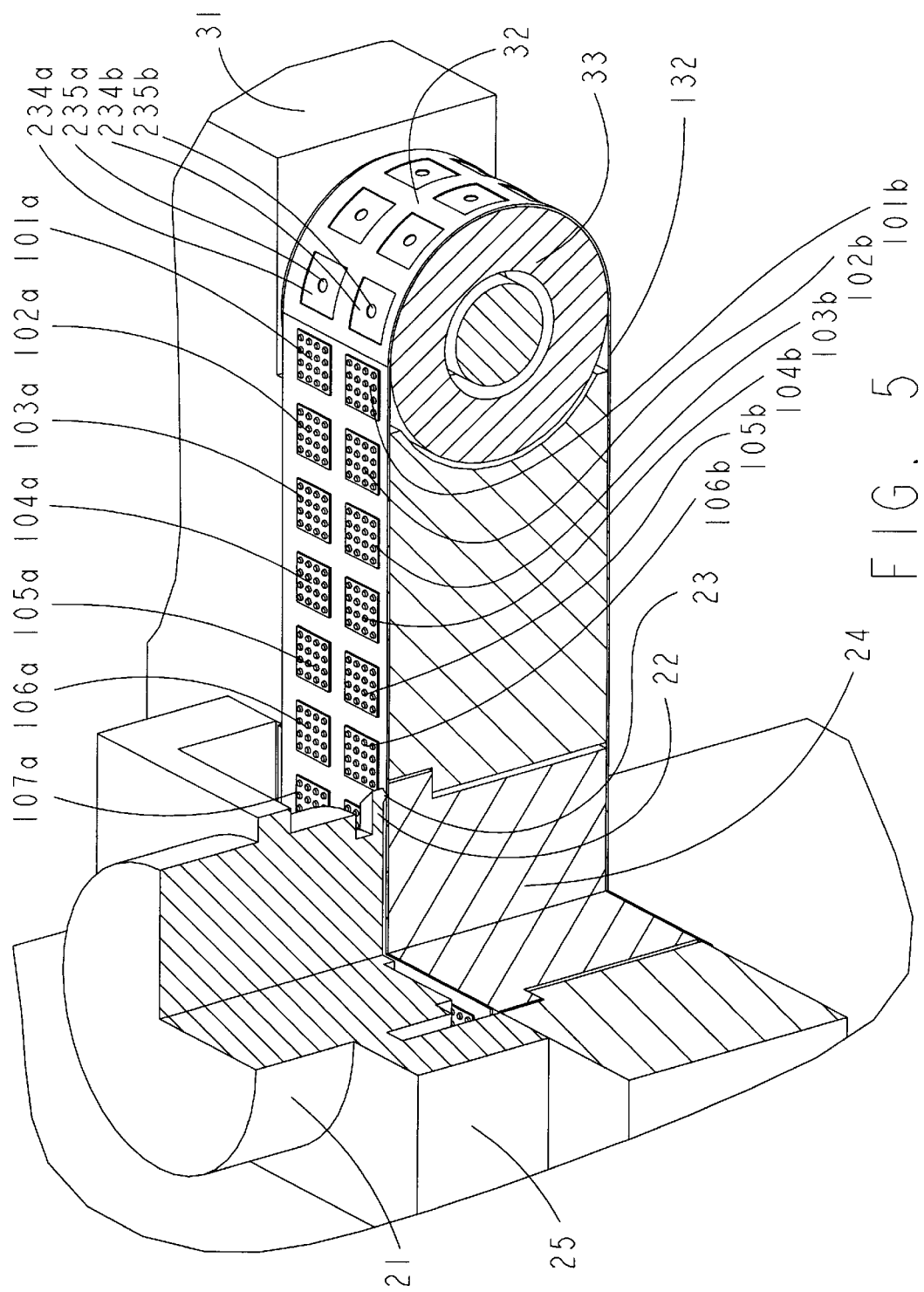
FIG. 5 is a partially cut away view of the machine of FIG. 4.

The devices fit into pockets 234a . . . 234d in conveyor 32. This arrangement allows for precision placement of the devices relative to flycutting tool 22. FIG. 5, which shows a portion of the cutting system cutaway, illustrates this arrangement in greater detail.

Belt 32 passes over a roller 33, which would be powered by a motor, which is technology known in the art. Conveyor belt 32 is supported over most of its length by structure 132. However, in the region below flycutting tool 22, belt 32 passes over block 24. Block 24 is a very flat porous surface, such as might be made of porous silicon carbide. Porous silicon carbide is a preferred material because it can be made flat, on the sub-micron level. Because it is flat and smooth, it will not wear conveyor belt 32.

To ensure that devices are properly positioned when they are cut, a vacuum is drawn through porous block 24. The pockets, such as 234a . . . 234d, in conveyor belt 32 have flat bottoms, which are drawn against the very flat surface of block 24, thereby keeping the bottom of each pocket very flat at a fixed position relative to the diamond cutting tool 23 that makes up flycutting tool 22. Each of the pockets has a hole, such as hole 235a or 235b in the flat bottom. Through these holes, such as 235a and 235b, the vacuum draws devices in the pockets against the flat bottom. Thus, the devices are held flat very accurately in a plane parallel to the flycutting tool 22 and the solder balls are cut to have the shapes shown in FIG. 1B. The solder balls can be cut to have the required planarity.

Having described one embodiment, numerous alternative embodiments or variations might be made. For example, the tips 13 could be given shapes other than the half ellipse shapes pictured in FIG. 3B. Half circular shapes might be used. Alternatively, the shape of tips 13 can be computed using well known slip-plane theory or Hertz contact theory or numerical methods to set penetration into solder balls 2a at a depth that optimizes the electrical contact.

Also, it is not necessary that the posts 12 be formed as described. Posts 12 could be formed by, for example, attaching silicon blocks to base 11. Alternatively, posts 12 could be ground from a monolithic silicon substrate or fabricated using photolithographic techniques. To provide the required conductivity, the silicon posts could be doped and/or plated with metal. The posts could then be planarized, in a similar fashion to the way solder balls are planarized, to within about 1 micron. Then, the blocks could be etched to make tips of the desired shape.

Also, it was described that the solder balls are cut with a flycutting tool. For most applications, a single point diamond flycuttter will cut with high speed, low force and will not leave burrs on the balls. However, a lapping plate, grinding wheel, milling cutter or other equivalent cutting tool might also be used. In addition, it is not necessary that the solder balls be planaraized by cutting solder away. The solder balls might be pressed flat on top with a pressure plate. The plate might be heated to promote deformation of the solder balls. Alternatively, the solder balls might be planarized with a laser.

In addition, it should be noted that a continuous process is shown where the planarization occurs as the devices exit an oven. This process is preferred because it reduces the number of handling operations. However, it would be possible to planarize the ball grid array devices in a batch operation. After being processed in an oven, the devices might be loaded into trays or other transport medium and moved to another processing machine. The devices could then be moved one at a time or in groups into holders that likewise positioned the devices accurately relative to a cutting tool.

Also, it was described that the planarized ball grid array was tested with rigid probes.

Therefore, the invention should be limited only by the spirit and scope of the appended claims.

What is claimed is:

1. A method of manufacturing integrated circuit chips comprising the steps of:
    a) forming an integrated circuit package having a plurality of solder balls on one surface thereof; and
    b) cutting, on each of the plurality of solder balls, a flat portion on a surface thereof.

2. The method of claim 1 wherein the step of cutting a flat portion comprises cutting away the top of each solder ball.

3. The method of claim 2 wherein the step of cutting away comprises placing the device on a flat surface below a cutting tool.

4. The method of claim 1 wherein the flat portions of each of the plurality of solder balls falls within the same plane to within a tolerance of ±0.005 mm.

5. The method of claim 1 additionally comprising the steps of testing the integrated circuit chip by making electrical contact with the solder balls.

6. The method of claim 5 wherein the step of making electrical contact comprises making contact with an array of rigid contacts.

7. The method of claim 1 wherein the step of cutting a flat portion comprises the steps of:
    a) placing the integrated circuit package on a conveyor;
    b) passing the conveyor belt over a flat surface and forcing the integrated circuit package against the flat surface; and
    c) cutting the upper surface of the solder balls while the integrated circuit package is forced against the flat surface.

8. The method of claim 7 wherein the flat surface comprises porous ceramic.

9. The method of claim 8 wherein the step of forcing the integrated circuit package against the flat surface comprises drawing a vacuum through the ceramic.

10. The method of claim 9 wherein the conveyor belt includes a pocket and the step of placing the integrated circuit on the conveyor belt includes placing the integrated circuit in the pocket.

11. The method of claim 10 wherein the pocket has a lower surface having a hole formed therethrough and the step of drawing a vacuum includes drawing a vacuum through the hole to thereby draw the integrated circuit package against the flat surface.

12. The method of claim 11 additionally comprising continuously drawing the belt across the flat surface.

13. A method of manufacturing an printed circuit board using an integrated circuit chip comprising the steps of:
    a) manufacturing a plurality of integrated circuit chips according to a method comprising the steps of:
        i) forming an integrated circuit package having a plurality of solder balls on one surface thereof; and
        ii) forming, on each of the plurality of solder balls, a flat portion on a surface thereof, the flat portions being substantially parallel and substantially in the same plane;
    b) testing the plurality of integrated circuits by contacting the solder balls on their flat portions with an array of rigid probes, thereby determining functioning integrated circuit chips;
    c) placing a functioning integrated circuit on a printed circuit board and heating the solder balls to form a plurality of solder joints between the functioning integrated circuit package and the printed circuit board.

14. The method of claim 13 wherein the step of forming a flat portion comprises cutting away the top of each solder ball.

15. The method of claim 13 wherein the step of contacting the solder balls comprises making contact with an array of rigid contacts that pierce the surface of the flat portions of the solder balls.

16. A method of manufacturing integrated circuits comprising the steps of:
    a) providing an integrated circuit having a plurality of solder balls formed on a surface thereof;
    b) placing the integrated circuit over a flat surface with the solder balls facing away from the flat surface;
    c) planarizing the solder balls by cutting the solder balls at a substantially uniform height above the flat surface.

17. The method of claim 16 wherein the step of placing the integrated circuit over a flat surface includes placing the integrated circuit over a porous flat surface and drawing a vacuum through the flat surface.

18. The method of claim 16 wherein the step of planarizing comprises cutting with a flycutting tool.

19. The method of claim 16 wherein the step of placing the integrated circuit over a flat surface comprises placing the integrated circuit on a moving belt and moving the belt over the flat surface.

20. The method of claim 19 wherein the step of placing the integrated circuit over a flat surface includes placing the integrated circuit over a porous flat surface and drawing a vacuum through the flat surface.

* * * * *